United States Patent [19]

Maruyama et al.

[11] Patent Number: 5,438,269
[45] Date of Patent: * Aug. 1, 1995

[54] SPARKING VOLTAGE DETECTING DEVICE HAVING AN EMBEDDED CONDUCTIVE MEMBER

[75] Inventors: Shigeru Maruyama; Yuichi Shimasaki; Masaki Kanehiro; Takuji Ishioka; Shigeki Baba; Takashi Hisaki, all of Wako, Japan

[73] Assignee: Honda Giken Kogyo Kabushiki Kaisha, Tokyo, Japan

[*] Notice: The portion of the term of this patent subsequent to Apr. 26, 2011 has been disclaimed.

[21] Appl. No.: 980,035

[22] Filed: Nov. 23, 1992

[30] Foreign Application Priority Data

Nov. 28, 1991 [JP] Japan ................................ 3-339723

[51] Int. Cl.⁶ .................... F02P 17/00; G01R 19/165; G01R 1/06; G01R 15/00
[52] U.S. Cl. ........................................ 324/402; 324/390
[58] Field of Search ............... 324/379, 380, 390, 393, 324/402, 72.5, 126, 149, 399, 391; 73/117.3, 118.1

[56] References Cited

U.S. PATENT DOCUMENTS

| | | | |
|---|---|---|---|
| 4,090,130 | 5/1978 | Willenbecher, Jr. | 324/402 |
| 4,547,734 | 10/1985 | Spaude | 324/395 |
| 5,307,017 | 4/1994 | Maruyama et al. | 324/402 |

FOREIGN PATENT DOCUMENTS

52-118135 10/1977 Japan .

Primary Examiner—Walter E. Snow
Attorney, Agent, or Firm—Nikaido, Marmelstein, Murray & Oram

[57] ABSTRACT

A sparking voltage detecting device for an internal combustion engine having an ignition system having at least one secondary side high-tension cord, is mounted on the secondary side high-tension cord, for detecting sparking voltage generated in the engine. A main body formed of an insulating material has at least one through hole formed therein. The main body includes a pair of halves fabricated separately at least in part from each other and abutting each other along a line extending through the center of the main body. The high-tension cord is fitted through the through hole in a liquidtight manner. At least one conductive member is embedded in the main body at a location radially outward of the through hole and spaced from the high-tension cord by a predetermined distance.

8 Claims, 10 Drawing Sheets

SPARKING VOLTAGE DETECTING DEVICE HAVING AN EMBEDDED CONDUCTIVE MEMBER

BACKGROUND OF THE INVENTION

1. Field of the Invention

This invention relates to a sparking voltage detecting device for spark-ignition type internal combustion engines, which detects sparking voltage generated in the engine.

2. Prior Art

Conventionally, sparking voltage detecting devices are known, which detect sparking voltage occurring on the secondary side of an ignition system of an internal combustion engine. One of such devices is disclosed in Japanese Provisional Patent Publication (Kokai) No. 52-118135, which comprises a sensor formed of a strip of a conductive material wound on a high-tension cord connected to a spark plug. The sensor forms a capacitor having very small capacitance with a coating insulating material of the high-tension cord acting as a dielectric, the conductive material strip being serially connected to a measuring capacitor which is grounded at one end thereof. A signal voltage is generated across the measuring capacitor according to the principle of electrostatic potential division, which voltage is detected as the sparking voltage.

However, although the known sparking voltage detecting device is capable of ascertaining whether or not sparking voltage is occurring, it is unable to accurately detect waveforms of the sparking voltage, because the device has a simple structure formed of a conductive material strip wound on the high-tension cord, and hence is liable to have changes in the electrostatic capacity due to vibrations, (humidity), (moisture) etc. As a result, the measured voltage largely varies, badly affecting the detecting accuracy and the effective life of the device. Moreover, the sensor is located close to a voltage source (high-tension cord) generating several tens thousands volts, which requires the use of an expensive protective circuit for effecting a failsafe action in the event of a high voltage leak, and hence is complicated in structure.

SUMMARY OF THE INVENTION

It is an object of the invention to provide a sparking voltage detecting device for an internal combustion engine, which has improved detecting accuracy and a prolonged life, and which can dispense with the use of a protective circuit for coping with high voltage leak or the like, while facilitating mounting high-tension cords onto a sensor thereof, and is therefore low in cost.

It is a further object of the invention to provide a sparking voltage detecting device for an internal combustion engine, which provides an stable output indicative of the detected sparking voltage.

It is another object of the invention to provide a sparking voltage detecting device for an internal combustion engine, which is less affected by external disturbances such as radio interference and external noise.

It is still another object of the invention to provide a sparking voltage detecting device for an internal combustion engine, which is light in weight and compact in size.

According to the invention, there is provided a sparking voltage detecting device for an internal combustion engine having an ignition system having at least one secondary side high-tension cord, the sparking voltage detecting device being mounted on secondary side high-tension cord, for detecting sparking voltage generated in the engine, comprising:

a main body formed of an insulating material and having at least one through hole formed therein, the high-tension cord being fitted through the through hole in a liquidtight manner, the main body including a pair of halves fabricated separately at least in part from each other and abutting each other along a line extending through a center of the main body; and at least one conductive member embedded in the main body at a location radially outward of the through hole and spaced from the high-tension cord by a predetermined distance.

In an internal combustion engine having a plurality of cylinders, and an ignition system having a plurality of secondary side high-tension cords corresponding in number to the number of cylinders, the main body has a plurality of through holes formed therein, which correspond in number to the number of the cylinders, the high-tension cords being fitted, respectively, through the through holes in a liquidtight manner, the main body including a pair of halves fabricated separately at least in part from each other and abutting each other along a line extending through the center of the main body. At least one conductive member is embedded in the main body at a location radially outward of the through holes and spaced from the high-tension cords by a predetermined distance.

In a preferred form of the invention, there is provided a sparking voltage detecting device for an internal combustion engine having a plurality of cylinders, and an ignition system having a plurality of secondary side high-tension cords corresponding in number to the number of the cylinders, the sparking voltage detecting device including a sensor mounted on the secondary side high-tension cords, for detecting sparking voltage generated in the engine, the sensor comprising:

a main body formed of an insulating material and having a plurality of through holes formed therein, the through holes corresponding in number to the number of the cylinders, the high-tension cords being fitted, respectively, through the through holes in a liquidtight manner, the main body including a pair of halves fabricated separately at least in part from each other and abutting each other along a line extending through the center of the main body; and at least one conductive member embedded in the main body at a location radially outward of the through holes and spaced from the high-tension cords by a predetermined distance.

Advantageously, the sensor further includes at least one shielding member embedded in the main body at a location outward of the conductive member radially of the through holes.

Also advantageously, the sensor further includes at least one insulating member formed of ceramics, the insulating member being embedded in the main body at a location between the through holes and the conductive member.

The above and other objects, features, and advantages of the invention will become more apparent from the following detailed description taken in conjunction with the accompanying drawings.

DETAILED DESCRIPTION

The invention will now be described in detail with reference to the drawings showing embodiments thereof.

Figure 1:
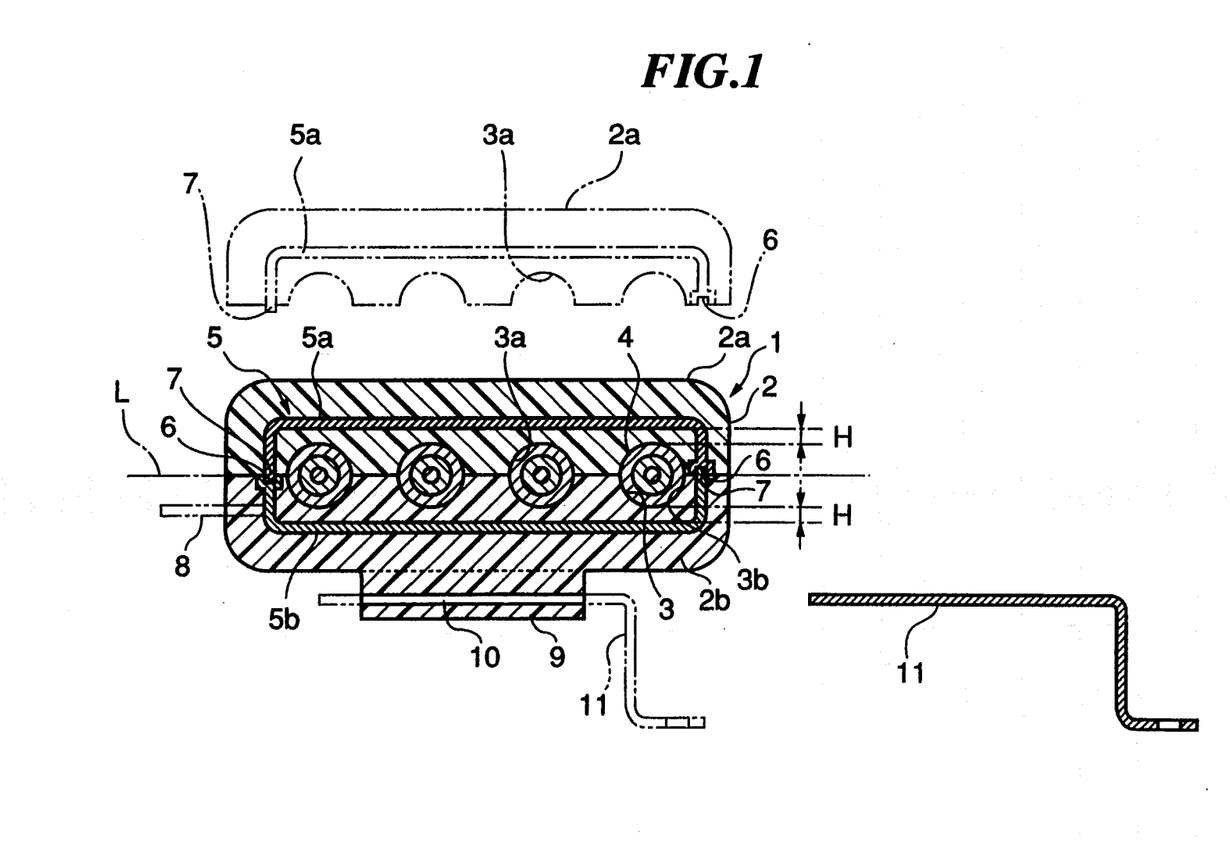
FIG. 1 is a longitudinal sectional view of a sensor of a sparking voltage detecting device for an internal combustion engine, according to a first embodiment of the invention.
Figure 2:
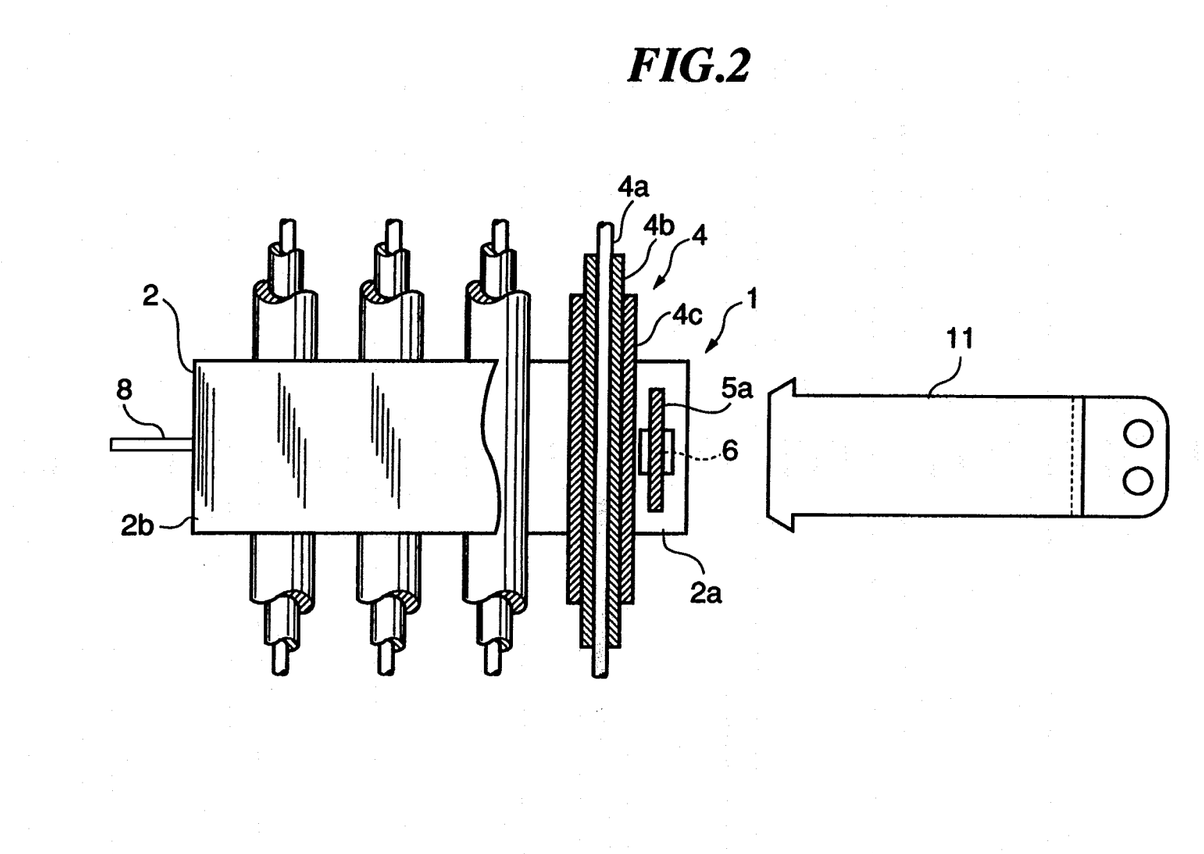
FIG. 2 is a top plan view, partly in section, of the sensor.

Referring first to FIGS. 1 and 2, there is illustrated a sensor 1, which forms an essential part of a sparking voltage detecting device for an internal combustion engine, according to a first embodiment of the invention. The sensor 1 has a main body 2 in the form of a block, which is formed of an insulating material such as rubber (EPDM) having high withstand voltage and silicon. The main body 2 has an oblong or generally rectangular cross section and is formed therein with a plurality of, e.g. four, through holes 3 corresponding in number to the number of cylinders of an engine, not shown. These through holes 3 are disposed such that their centers are located along a common line L intersecting with their axes at right angles, i.e. a line extending along the axis of the block 2. The holes 3 are arranged at equal intervals in a direction perpendicular to their axes. The main body 2 is formed of a pair of upper and lower halves 2a and 2b which are fabricated in bodies completely separated from each other and disposed to abut each other along the above-mentioned line L as a dividing line. The upper and lower halves 2a, 2b have their opposed abutting surfaces formed with semicylindrical recesses 3a and 3b forming the through holes 3.

Secondary side high-tension cords 4 of an ignition system of the engine are fitted through the through holes 3 in a liquidtight manner, respectively. These high-tension cords 4 each have a core wire 4a, and inner and outer coating layers 4b and 4c coated over the core wire 4a. The core wire 4a is comprised of a central wire formed of an aramid fiber or the like, and an outer wire formed of a Nichrome wire or the like wound around the central wire via an insulating material. The inner coating layer 4b is formed of an insulating material such as soft crosslinked polyethylene and high withstand voltage rubber (EPDM). The outer coating layer 4c is formed of an insulating material such as high withstand voltage rubber (EPDM). Each through hole 3 has an inner peripheral surface thereof disposed in liquidtight contact with the outer peripheral surface of the high-tension cord 4 to prevent water from infiltrating into the gap between the through hole 3 and the high-tension cord 4.

A conductive member 5, which is formed of a conductive material such as copper and an alloy thereof, is embedded in the main body 2. The conductive member 5 has a hollow tubular body having an oblong or generally rectangular cross section and encloses all the through holes 3. The conductive member 5 is located radially outward of the through holes 3 at a predetermined distance H from the outer peripheral surfaces of the high-tension cords 4 fitted through the through holes 3, which distance is set at such a value that the conductive member 5 is not substantially influenced by corona discharge from the high-tension cords 4, e.g., approximately 5-10 mm. The conductive member 5 is formed of upper and lower halves 5a and 5b which are fabricated separately from each other, and embedded in the upper and lower halves 2a, 2b of the main body 2, respectively. The upper half 5a has its peripheral edge formed with an engaging projection 7, while the lower half 5b has its peripheral edge formed with an engaging recess 6 mated with the engaging projection 7 of the upper half 5a. Thus, the two halves 5a, 5b are coupled together with their peripheral edges 6, 7 mated with each other. Connected to one end of the lower half 5b of the conductive member 5 is one end of a lead wire 8 formed of a shielding wire, which is comprised of a core formed of a conductive material, a shielding member formed of a conductive material and wound on the core via an insulting material, and an outer coating layer formed of an insulating material and wound on the shielding member. The lead wire 8 extends outwardly from one axial end of the main body 2 for transmitting a voltage signal from the conductive member 5 to a sparking voltage detecting unit, hereinafter referred to.

The lower half 2b of the main body 2 has a projection wall 9 downwardly extending integrally from a lower side surface thereof and formed therein with a slit 10 in which a fitting bracket member 11 is rigidly fitted for mounting the sensor 1 on a suitable portion of the engine.

The lead wire 8 is previously connected to the lower half 5b of the conductive member 5, and then the upper and lower halves 5a, 5b of the conductive member 5 are placed, respectively, into molds for forming the upper and lower halves 2a, 2b of the block or main body 2 to be molded together with the halves 2a, 2b.

Figure 3:
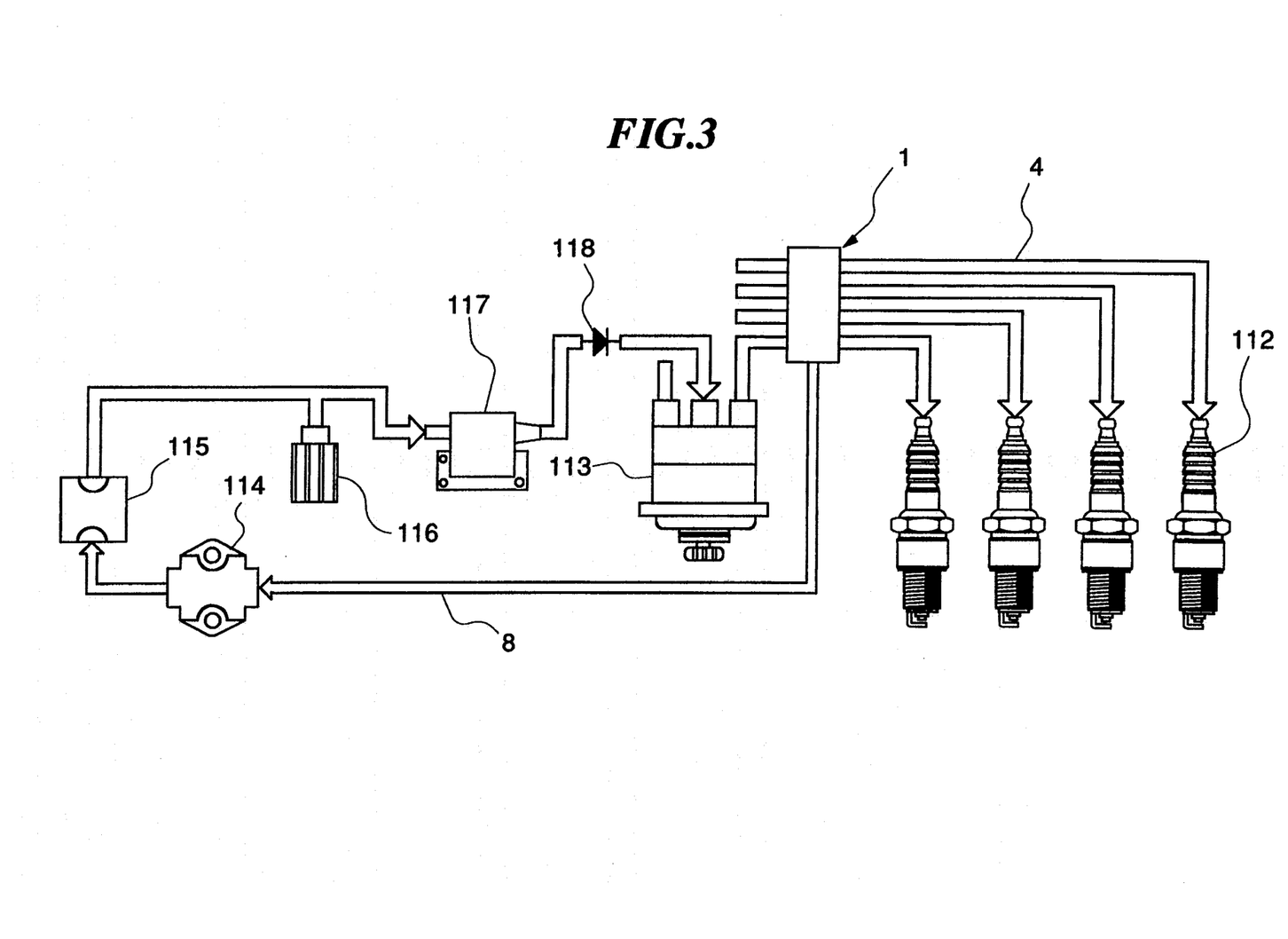
FIG. 3 is a schematic view of the whole arrangement of an ignition system of the engine, which is provided with the sparking voltage detecting device according to the invention.
Figure 4:
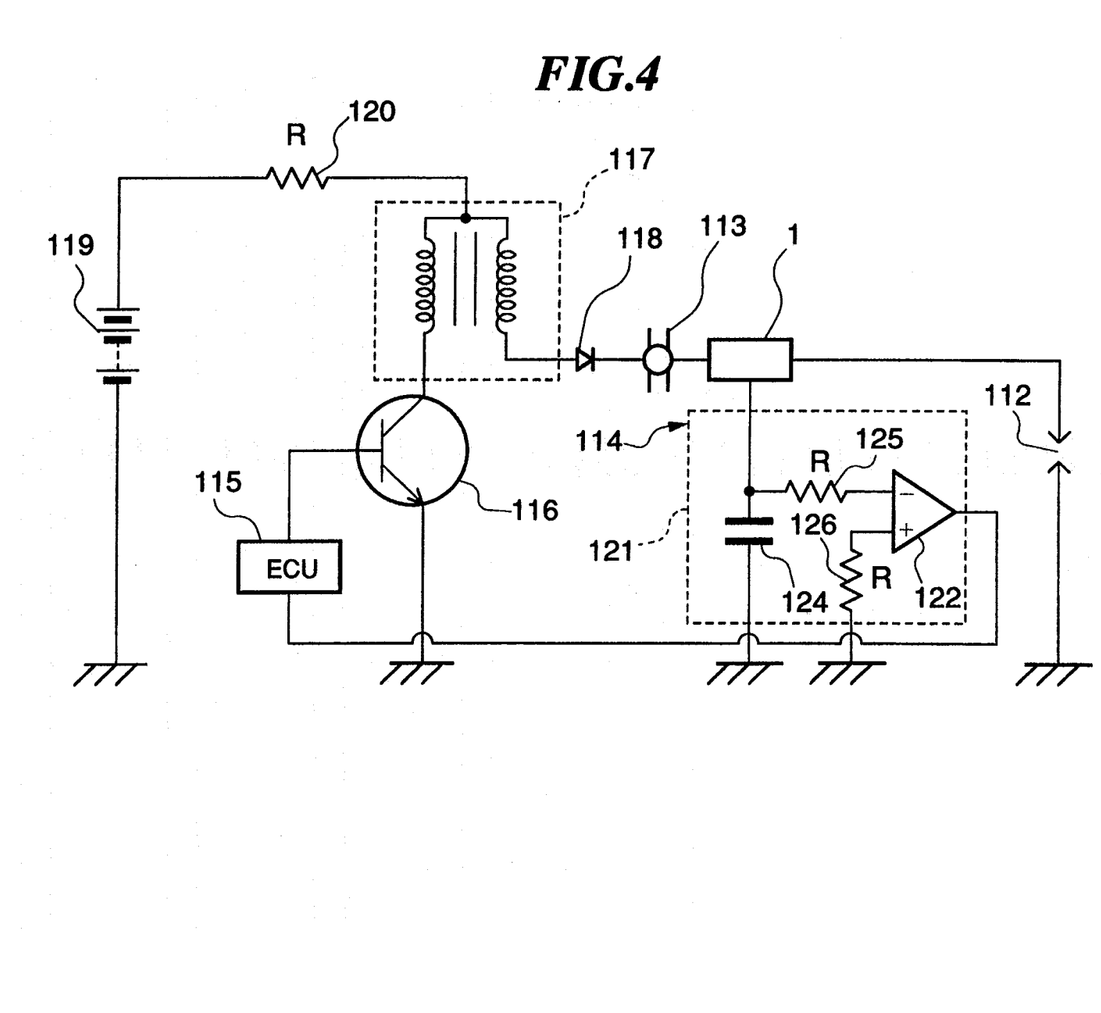
FIG. 4 is a circuit diagram of the electrical connection of the ignition system.

The sensor 1 of the sparking voltage detecting device constructed as above is incorporated in the ignition system of the engine, as shown in FIGS. 3 and 4. More specifically, first the upper and lower halves 2a, 2b of the main body 2 are set into a position where they are opposed to each other in a manner separated from each other, and then the high-tension cords 4 are placed between the opposed semicylindrical recesses 3a, 3b, followed by abutting the two halves 2a, 2b against each other and bonding them together with an adhesive. Thus, the high-tension cords 4 are fitted through the through holes 3 in a liquidtight manner. As shown in FIGS. 3 and 4, the high-tension cords 4 thus fitted through the respective through holes 3 of the main body 2 of the sensor 1 are connected at one ends thereof to respective spark plugs 112 and at the other ends to an output of a distributor 113. The lead wire 8 extending from the main body 2 is connected to an input of the voltage detecting unit 114. The voltage detecting unit 114 and the sensor 1 cooperate to form the sparking voltage detecting device. An output of the voltage detecting unit 114 is connected to an input of an electronic control unit (ECU) 115. An output of the ECU 115 is connected to the input of the distributor 113 through an igniter 116, an ignition coil 117, and a diode 118. In FIG. 4, reference numeral 119 designates a power supply (battery), a positive terminal of which is connected to the ignition coil 117 through a resistance 120. The voltage detecting unit 114 has a determining circuit 121 which determines whether the sparking voltage is normal or not. The circuit 121 is formed by an operational amplifier 122, a capacitor 124, and resistances 125 and 126.

The operation of the sparking voltage detecting device constructed as above will now be described.

The ECU 115 supplies an ignition command signal to the igniter 116 at a timing determined by the rotational speed of the engine, etc. The igniter 116 cuts off primary current flowing in the ignition coil 115 in response to the ignition command signal to cause generation of high voltage on the secondary side of the ignition coil 117, which voltage is distributed by the distributor 113 to be applied to the spark plugs 112 of the engine cylinders through the respective high-tension cords 4.

The above high voltage, i.e. sparking voltage is detected by the sensor 1, an output voltage signal of which is supplied to the voltage detecting unit 114 where the determining circuit 121 compares the sparking voltage with a predetermined voltage value to determine whether the sparking voltage is normal or not, and supplies a determination signal to the ECU 115 as information for setting the ignition timing.

The above described operation is substantially identical with that of a conventional ignition system.

In the present embodiment, as described hereinbefore, the conductive member 5 is embedded in the main body 2 formed of an insulating material at a location radially outward of the through holes 3 at a predetermined distance from the outer peripheral surfaces of the high-tension cords 4, and the high-tension cords 4 are supportedly fitted through the through holes 3. As a result, the conductive member 5 is firmly held in spaced relation to the high-tension cords 4 with an accurate predetermined clearance between the members 4, 5. Therefore, it is possible to prevent the conductive member 5 from being adversely influenced by corona discharge from the high-tension cords 4 so that the conductive member 5 has a prolonged life and can provide a stable and accurate detected voltage output.

Besides, since the high-tension cords 4 are fitted through the through holes 3 in a liquidtight manner and since the conductive member 5 is molded together with the main body 2 in a manner which is entirely embedded within the main body 2, the electrostatic capacity of the conductive member 5 is not liable to be affected by vibrations, humidity (moisture), etc.

Further, since in manufacturing the sensor 1, the main body 2 can be split along a line extending through the centers of the through holes 3, assemblage of the sensor 1 and the high-tension cords 4 can be made with easiness.

Furthermore, since the conductive member 5 has a hollow body of an oblong or generally rectangular cross section and encloses all the through holes 3, a single lead wire 8 suffices to transmit a signal voltage from the sensor 1, thereby enabling to design the whole sensor 1 compact in size and light in weight. Still further, since the lead wire 8 is formed by a shielding wire, the sparking voltage detecting device has improved output voltage stability against external disturbances such as radio interference and noise.

Next, second to thirteenth embodiments of the invention will be described with reference to FIGS. 5 to 16. In FIGS. 5 to 16, elements and parts corresponding to those in FIGS. 1 to 4, described above, are designated by identical reference numerals, description of which is omitted.

Figure 5:
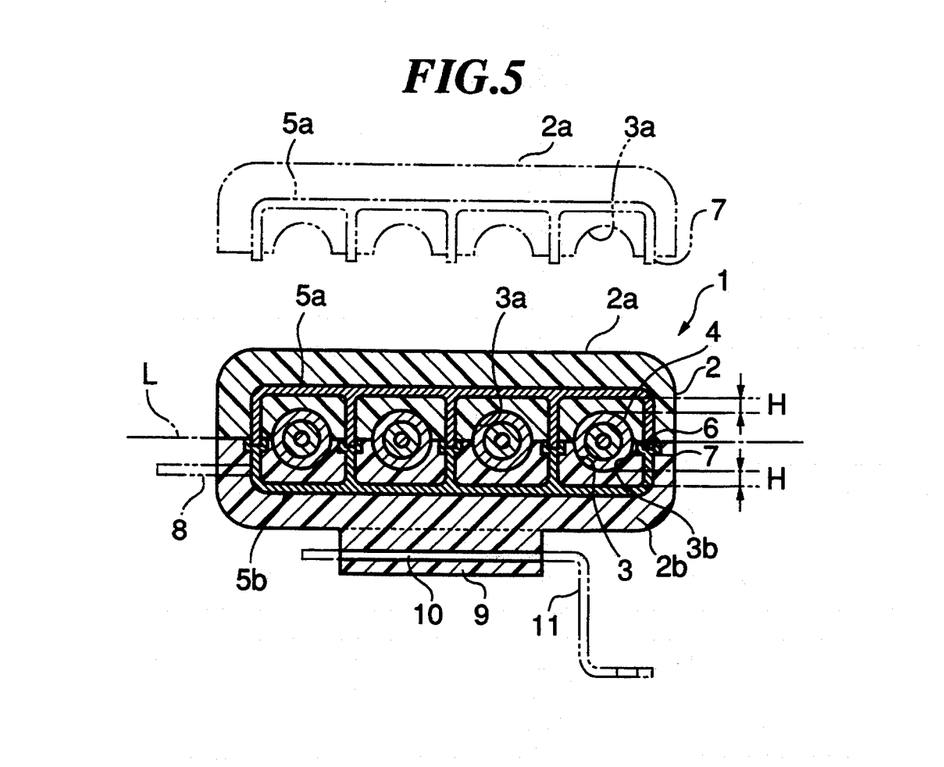
FIG. 5 is a longitudinal sectional view of a sensor of a sparking voltage detecting device according to a second embodiment of the invention.

FIG. 5 shows a second embodiment of the invention. A conductive member 5 according to the second embodiment is in the form of a four-sided hollow body having a plurality, e.g. five, partition walls extending integrally between opposite flat platelike base portions of the halves 5a, 5b and defining separate compartments having a space of a square cross section. The through holes 3 are enclosed by the respective compartments. The halves 5a, 5b of the conductive member 5 are coupled together, with an engaging projections 7 formed at ends of the partition walls of the upper half 5a mated with engaging recesses 6 formed at opposed ends of the inner partition walls of the lower half 5b, respectively.

Figure 6:
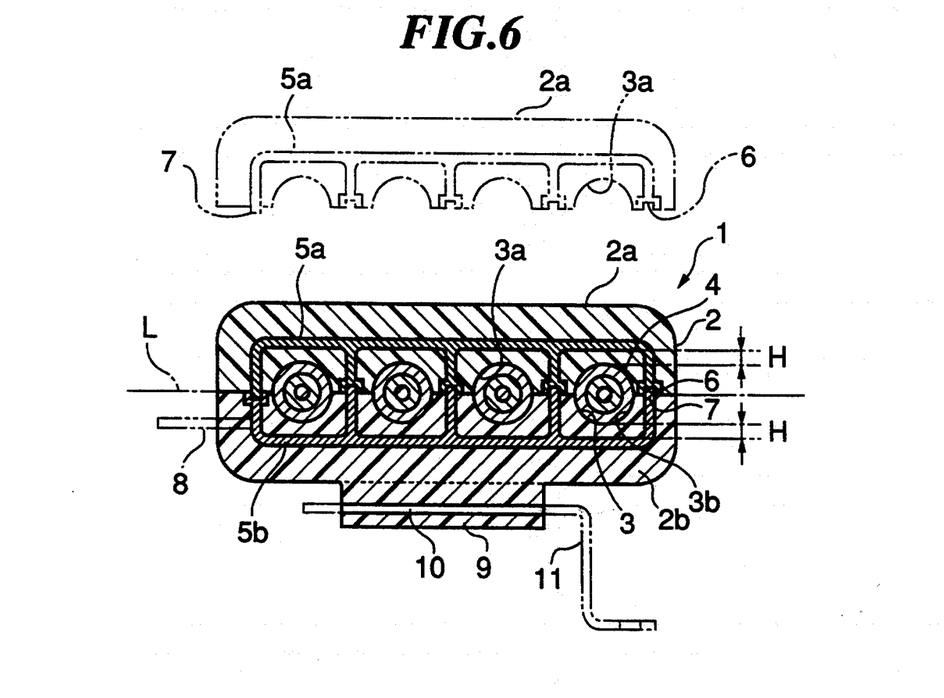
FIG. 6 is a longitudinal sectional view of a sensor of a sparking voltage detecting device according to a third embodiment of the invention.

FIG. 6 shows a third embodiment of the invention. According to the third embodiment, one end of one of the outer partition walls of the upper half 5a of the conductive member 5 has an engaging projection 7 and ends of the other partition walls thereof engaging recesses 6, while an opposed end of one of the outer partition walls of the lower half 5b has an engaging recesses 6 and opposed ends of the other partition walls thereof engaging projections 7.

Figure 7:
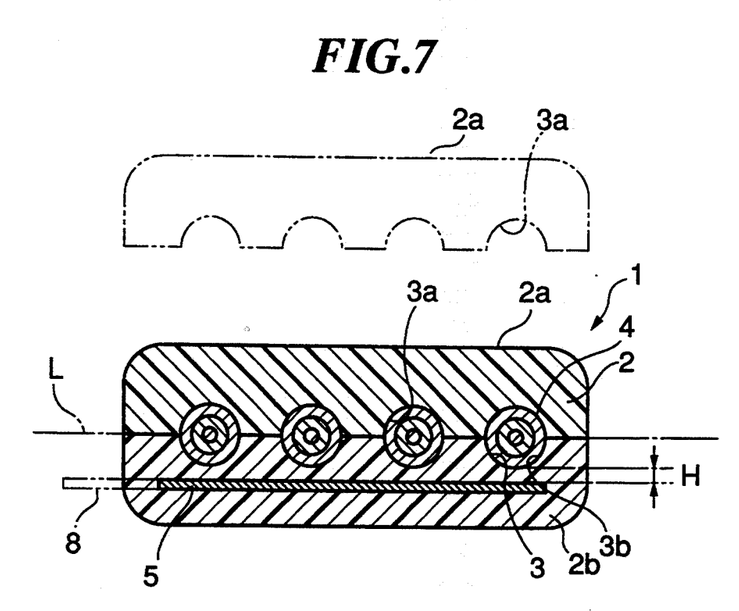
FIG. 7 is a longitudinal sectional view of a sensor of a sparking voltage detecting device according to a fourth embodiment of the invention.

FIG. 7 shows a fourth embodiment of the invention. A conductive member 5 according to the fourth embodiment 5 is embedded in the lower half 2b of the main body 2 and arranged at one lateral side of the main body 2 with respect to the line L extending through the centers of the through holes 3. The conductive member 5 is in the form of a flat plate having a length at least equal to the length of the row of the through holes 3. The conductive member 5 is located radially outward of the through holes 3 at the predetermined distance H from the outer peripheral surfaces of the high-tension cords 4.

Figure 8:
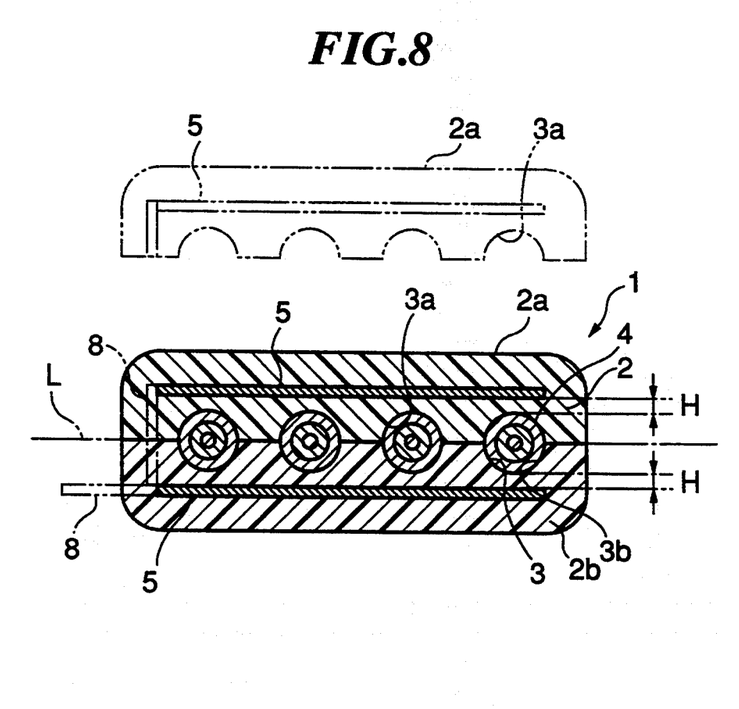
FIG. 8 is a longitudinal sectional view of a sensor of a sparking voltage detecting device according to a fifth embodiment of the invention.

FIG. 8 shows a fifth embodiment of the invention. According to the fifth embodiment, a pair of conductive members 5 and 5 in the form of a flat plate similar to the conductive member of the fourth embodiment described above are embedded, respectively, in the upper and lower halves 2a, 2b of the main body 2 and symmetrically arranged at opposite lateral sides of the main body 2 with respect to the line L extending through the centers of the through holes 3. One end of the lead wire 8 is connected to one ends of the conductive members 5, 5.

Figure 9:
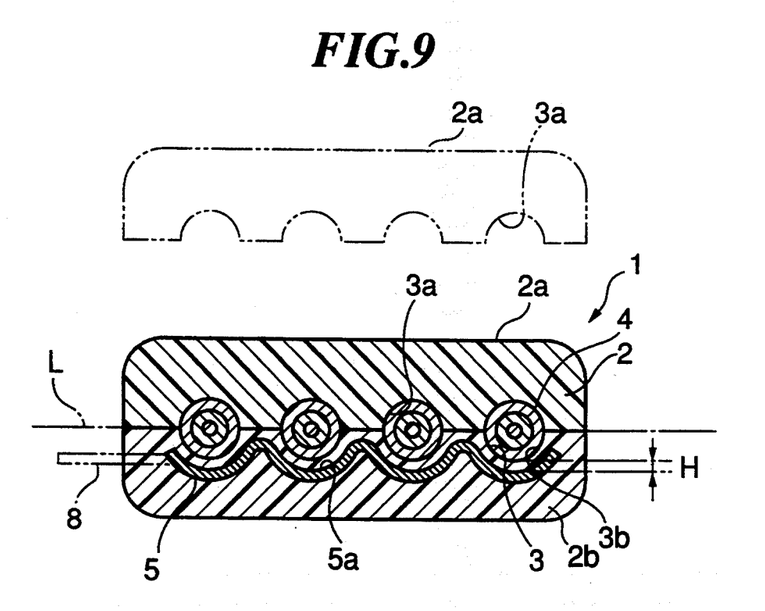
FIG. 9 is a longitudinal sectional view of a sensor of a sparking voltage detecting device according to a sixth embodiment of the invention.

FIG. 9 shows a sixth embodiment of the invention. According to the sixth embodiment, a single conductive member 5 in the form of a corrugated or waved plate is embedded in the lower half 2b of the main body 2 and arranged at one lateral side of the block or main body 2 with respect to the line L extending through the centers of the through holes 3. The conductive member 5 has a length at least equal to the length of the row of the through holes 3. One end of the lead wire 8 is connected to one end of the conductive member 5. The conductive member 5 has concave surfaces 5a facing the respective through holes 3 in concentricity thereto.

Figure 10:
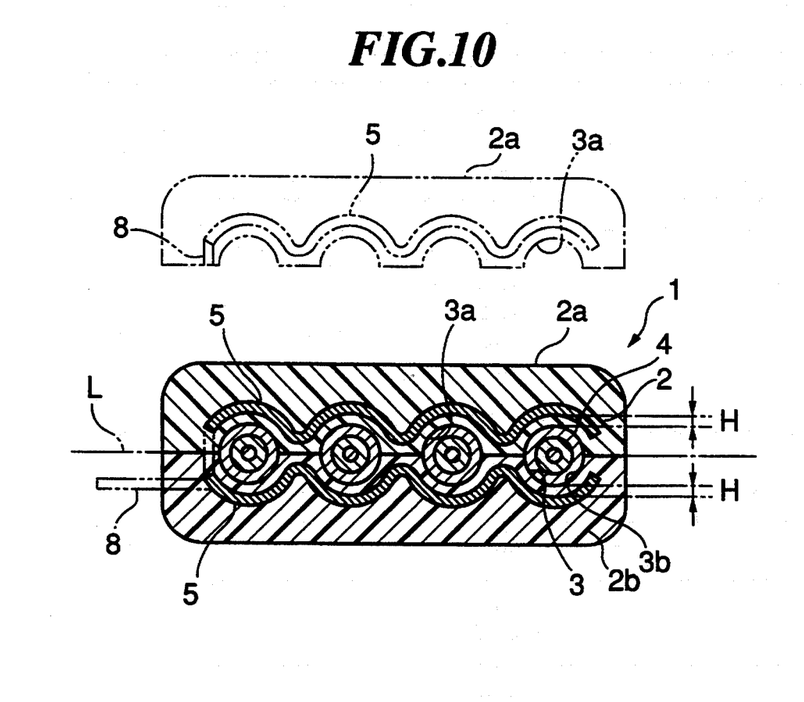
FIG. 10 is a longitudinal sectional view of a sensor of a sparking voltage detecting device according to a seventh embodiment of the invention.

FIG. 10 shows a seventh embodiment of the invention. According to the seventh embodiment, a pair of conductive members 5 and 5 in the form of a corrugated or waved plate similar to the conductive member of the sixth embodiment described above are embedded, respectively, in the upper and lower halves 2a, 2b of the main body 2 and symmetrically arranged at opposite lateral sides of the main body 2 with respect to the line L extending through the centers of the through holes 3. One end of the lead wire 8 is connected to one ends of the conductive members 5, 5.

Figure 11:
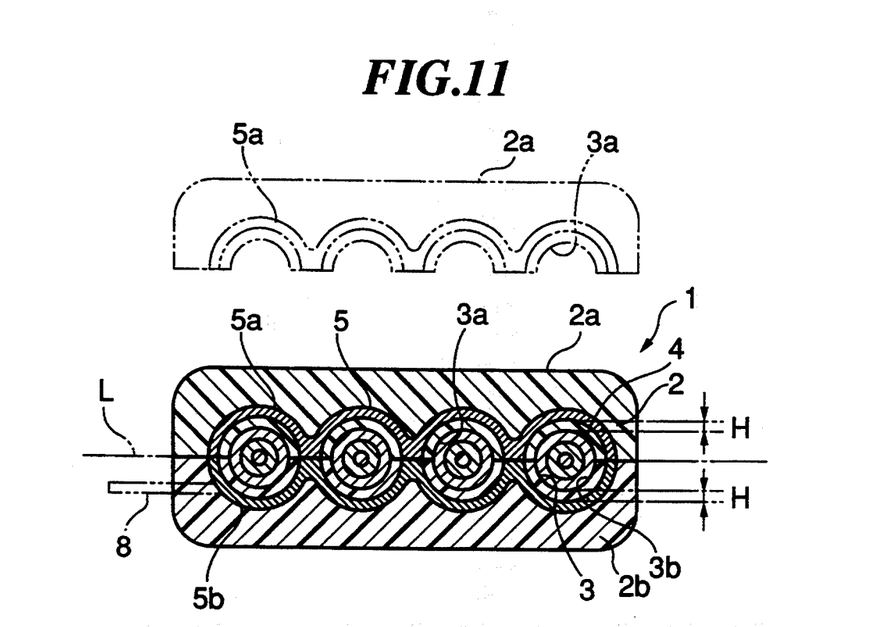
FIG. 11 is a longitudinal sectional view of a sensor of a sparking voltage detecting device according to an eighth embodiment of the invention.

FIG. 11 shows an eighth embodiment of the invention. According to the eighth embodiment, the conductive member 5 has a plurality of, e.g. four, cylindrical portions 5c enclosing the respective through holes 3. Each cylindrical portion 5c has a cylindrical hole concentric with the corresponding through hole 3 and is arranged radially outward of the corresponding through hole 3 and spaced from the outer peripheral surface of the corresponding high-tension cord 4 by a predetermined distance H. The conductive member 5 is formed of upper and lower halves 5a and 5b embedded, respectively, in the upper and lower halves 2a, 2b of the main body 2. The upper and lower halves 5a, 5b have their opposed surfaces formed with semicylindrical recesses and abut each other at the opposed abutting surfaces of the halves 2a, 2b of the main body 2 to form the cylindrical portions 5c.

Figure 12:
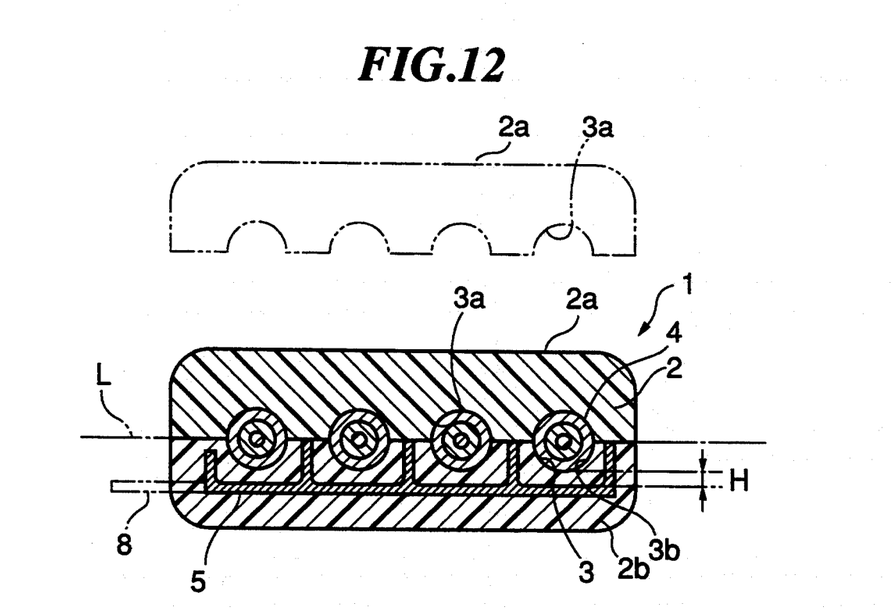
FIG. 12 is a longitudinal sectional view of a sensor of a sparking voltage detecting device according to a ninth embodiment of the invention.

FIG. 12 shows a ninth embodiment of the invention. According to the ninth embodiment, the conductive member 5 is embedded in the lower half 2b of the main body 2 and has a plurality of, e.g. five walls extending integrally from a flat platelike base portion to an opposed abutting surface of the lower half 2b and parallel with each other to form compartments partly enclosing the respective through holes 3, The conductive member 5 is formed in a single piece such that compartment-forming portions thereof are integrally combined with each other.

Figure 13:
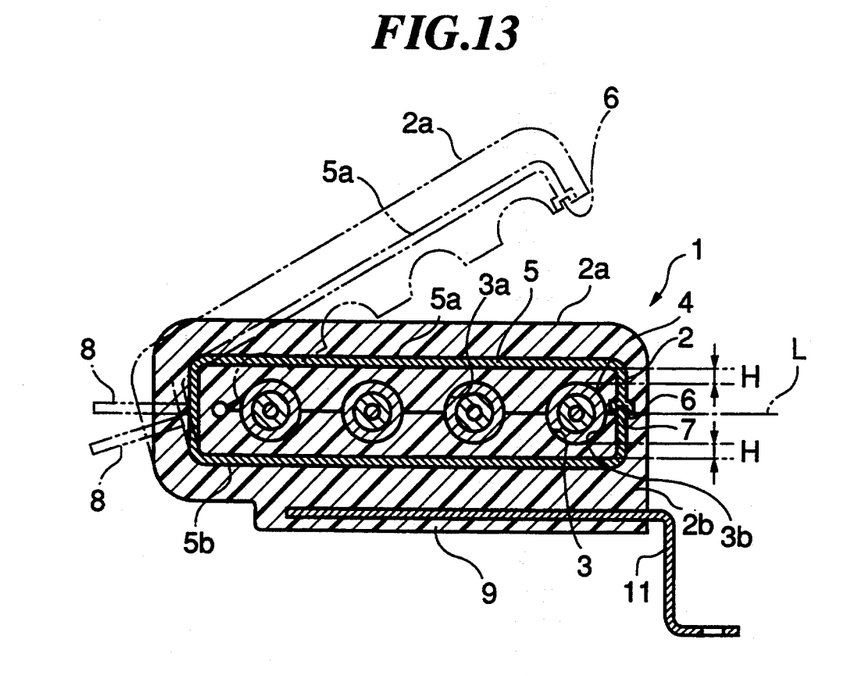
FIG. 13 is a longitudinal sectional view of a sensor of a sparking voltage detecting device according to a tenth embodiment of the invention.

FIG. 13 shows a tenth embodiment of the invention. According to the tenth embodiment, the two halves 2a, 2b of the main body 2 are not completely separated but the main body 2 is formed in a single piece such that the two halves 2a, 2b are integrally combined with each other at one end thereof. The main body 2 is formed of a flexible insulating material such as high withstand voltage rubber (EPDM) so that the halves 2a, 2b can be bent or pivoted relative to each other about the one end thereof. The conductive member 5 is configured similarly to the conductive member of the first embodiment shown in FIG. 1 but it is formed in a single piece such that the two halves 5a, 5b are combined together at one end thereof. A mounting bracket member 11 is fitted in a projection wall 9 formed integrally on a lower surface of the lower half 2b of the main body 2.

Figure 14:
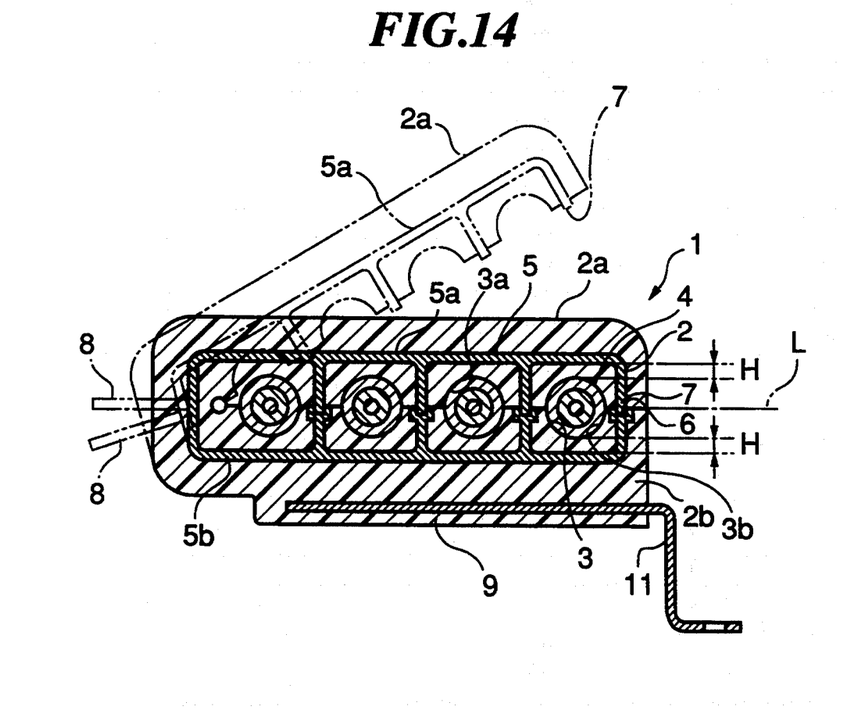
FIG. 14 is a longitudinal sectional view of a sensor of a sparking voltage detecting device according to an eleventh embodiment of the invention.

FIG. 14 shows an eleventh embodiment of the invention. According to the eleventh embodiment, the main body 2 and the means for fitting the mounting bracket member 11 to the main body 2 are identical with those of the tenth embodiment shown in FIG. 13 described above. The conductive member 5 is configured similarly to the conductive member of the second embodiment shown in FIG. 5 but it is formed in a single piece such that the two halves 5a, 5b are combined together at one end thereof.

Figure 15:
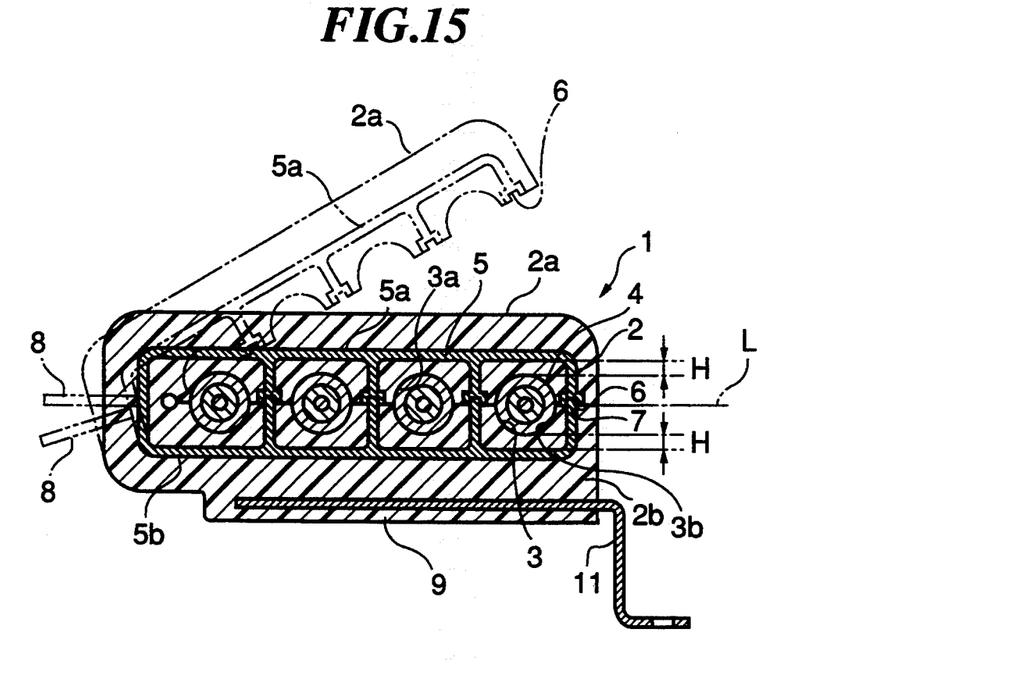
FIG. 15 is a longitudinal sectional view of a sensor of a sparking voltage detecting device according to a twelfth embodiment of the invention.

FIG. 15 shows a twelfth embodiment of the invention. According to the twelfth embodiment, the main body 2 and the means for fitting the mounting bracket member 11 to the main body 2 are identical with those of the eleventh embodiment shown in FIG. 14 described above. The conductive member 5 is configured similarly to the conductive member of the third embodiment shown in FIG. 6 but it is formed in a single piece such that the two halves 5a, 5b are combined together at one end thereof.

Figure 16:
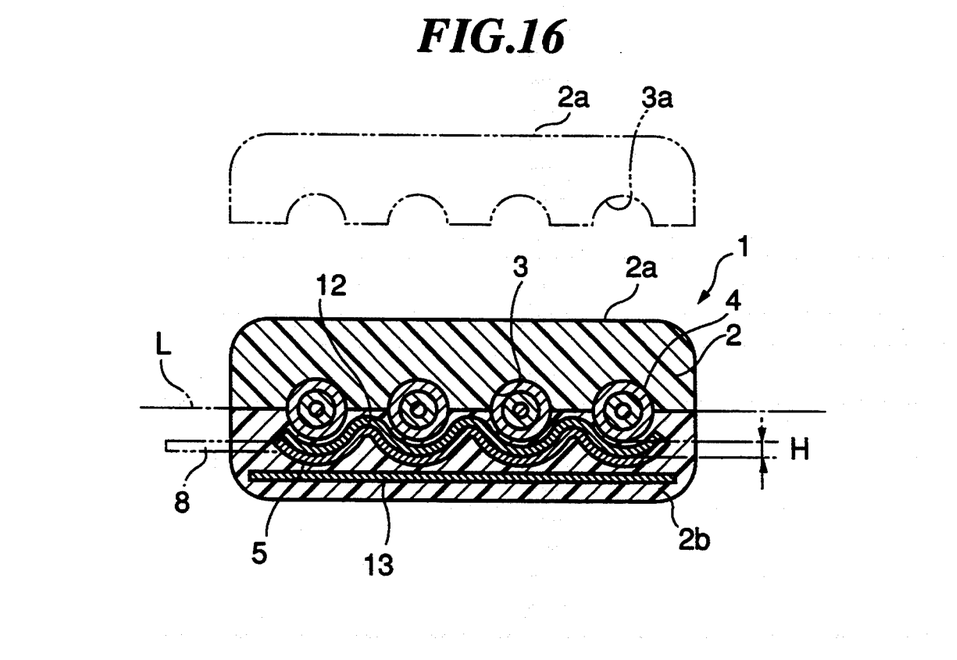
FIG. 16 is a longitudinal sectional view of a sensor of a sparking voltage detecting device according to a thirteenth embodiment of the invention.

FIG. 16 shows a thirteenth embodiment of the invention. The thirteenth embodiment is substantially identical in arrangement with the sixth embodiment of FIG. 9, described hereinbefore, except that an insulating member 12 formed of ceramics in the form of a corrugated or waved plate is attached to the whole inner side surface of a corrugated conductive member 5 facing the through holes 3, and a shielding member 13 in the form of a flat plate is embedded in the lower half 5b of the main body 2 at a side outward of the conductive member 5 radially of the through holes 3. One end of the lead wire 8 is connected to one end of the conductive member 5, as well as to one end of the shielding member 13.

According to the thirteenth embodiment described above, a shielding member is additionally arranged at a location outward of the conductive member radially of the through holes. As a result, as compared with the arrangements of the first to twelfth embodiments previously described, the sensor 1 is less susceptible to the influence of radio interference from the outside, in addition to the effects of the first to thirteenth embodiments described hereinbefore.

Although in the thirteenth embodiment both the shielding member and the insulating member formed of ceramics are additionally provided, only the shielding member may be provided. Alternatively, the shielding member and/or the ceramic insulating member may be also additionally provided in the first to twelfth embodiments.

Although in the above described embodiments four through holes 3 are provided in the main body 2, this is not limitative, but the number of the through holes may be set to any other number corresponding to the number of the cylinders of the engine.

Of the above described first to thirteenth embodiments, the embodiments having a single conductive member 5 arranged at one lateral side of the main body 2 with respect to the line L extending through the centers of the through holes 3 are advantageous in that the whole sensor 1 can be designed compact in size. On the other hand, the embodiments having a pair of conductive members 5, 5 symmetrically arranged at opposite lateral sides of the main body 2 with respect to the line L extending through the centers of the through holes 3, or a conductive member 5 having a hollow body enclosing the through holes 3 are advantageous in that the sensor 1 can detect sparking voltage with higher accuracy and provide a stable detected voltage output. Further, if the conductive member 5 has an increased surface area facing the high-tension cords 4 in spaced relation thereto by a predetermined distance, the sparking voltage can be detected with still higher accuracy, since the electrostatic capacity is increased.

In the fourth to ninth embodiment and the thirteenth embodiment shown in FIGS. 7 to 12 and FIG. 16, respectively, the main body 2 may be formed in a single piece similarly to the tenth to twelfth embodiments.

As described hereinabove, according to the invention, at least one conductive member is embedded in a main body formed of an insulating material at a location radially outward of through holes formed in the main body, at a predetermined distance from the outer peripheral surfaces of high-tension cords fitted through the through holes, and the high-tension cords are supportedly fitted through the through holes. As a result, the conductive member is firmly held in spaced relation to the high-tension cords with an accurate predetermined clearance between the conductive member and the high-tension cords. Therefore, it is possible to prevent the conductive member from being adversely influenced by corona discharge from the high-tension cords so that the conductive member has a prolonged life and can provide a stable and accurate detected voltage output. Besides, since the high-tension cords are fitted through the through holes in a liquidtight manner, the electrostatic capacity of the conductive member is not liable to be affected by vibrations, humidity (moisture), etc. Further, since the main body is formed of a pair of halves separately fabricated and abutting each other along a line extending through the center of the main body, assemblage of the sensor and the high-tension cords can be made with easiness, permitting a reduction in the manufacturing cost. Still further, the sensor thus constructed can dispense with the use of a protective circuit for coping with high voltage leak.

What is claimed is:

1. A sparking voltage detecting device for an internal combustion engine having an ignition system having at least one secondary side high-tension cord, said sparking voltage detecting device including a sensor mounted on said secondary side high-tension cord, for detecting sparking voltage generated in said engine, said sensor comprising:

a main body formed of an insulating material and having at least one through hole formed therein, said high-tension cord being fitted through said through hole in a liquid-tight manner, said main body including a pair of halves fabricated separately at least in part from each other and abutting each other along a line extending through a center of said main body;

at least one conductive member entirely embedded in said main body at a location radially outward of said through hole and spaced from said high-tension cord by a predetermined distance, said of at least one conductive member molded together with said main body; and at least one shielding member embedded in said main body at a location outward of said conductive member radially of said through hole.

2. A sparking voltage detecting device for an internal combustion engine having a plurality of cylinders, and an ignition system having a plurality of secondary side high-tension cords corresponding in number to the number of said cylinders, said sparking voltage detecting device including a sensor mounted on said secondary side high-tension cords, for detecting sparking voltage generated in said engine, said sensor comprising:

a main body formed of an insulating material and having a plurality of through holes formed therein, said through holes corresponding in number to the number of said cylinders, said high-tension cords being fitted, respectively, through said through holes in a liquidtight manner, said main body including a pair of halves fabricated separately at least in part from each other and abutting each other along a line extending through a center of said main body;

at least one conductive member entirely embedded in said main body at a location radially outward of said through holes and spaced from said high-tension cords by a predetermined distance, said at least one conductive member molded together with said main body; and at least one shielding member embedded in said main body at a location outward of said conductive member radially of said through holes.

3. A sparking voltage detecting device for an internal combustion engine having an ignition system having at least one secondary side high-tension cord, said sparking voltage detecting device including a sensor mounted on said secondary side high-tension cord, for detecting sparking voltage generated in said engine, said sensor comprising:

a main body formed of an insulating material and having at least one through hole formed therein, said high tension cord being fitted through said through hole in a liquidtight manner, said main body including a pair of halves fabricated separately at least in part from each other and abutting each other along a line extending through a center of said main body;

at least one conductive member entirely embedded in said main body at a location radially outward of said through hole and spaced from said high-tension cord by a predetermined distance, said at least one conductive member molded together with said main body; and at least one insulating member formed of ceramics, said insulating member being embedded in said main body at a location between said through hole and said conductive member.

4. A sparking voltage detecting device for an internal combustion engine having a plurality of cylinders, and an ignition system having a plurality of secondary side high-tension cords corresponding in number to the number of said cylinders, said sparking voltage detecting device including a sensor mounted on said secondary side high-tension cords, for detecting sparking voltage generated in said engine, said sensor comprising:

a main body formed of an insulating material and having a plurality of through holes formed therein, said through holes corresponding in number to the number of said cylinders, said high-tension cords being fitted, respectively, through said through holes in a liquidtight manner, said main body including a pair of halves fabricated separately at least in part from each other and abutting each other along a line extending through a center of said main body;

at least one conductive member entirely embedded in said main body at a location radially outward of said through holes and spaced from said high-tension cords by a predetermined distance, said at least one conductive member molded together with said main body; and at least one insulating member formed of ceramics, said insulating member being embedded in said main body at a location between said through holes and said conductive member.

5. A sparking voltage detecting device as claimed in claim any of claims 2 or 4, wherein said halves of said main body abut each other along a line extending through said centers of said through holes.

6. A sparking voltage detecting device as claimed in claim any of claims 2 or 4, wherein said conductive member comprises a plurality of portions facing respective ones of said through holes, said portions being combined with each other.

7. A sparking voltage detecting device as claimed in any of claims 1 or 3, wherein said conductive member comprises a pair of halves symmetrically arranged at opposite lateral sides of said main body with respect to said through holes.

8. A sparking voltage detecting device as claimed in any of claims 2 or 4, wherein said conductive member comprises a pair of halves symmetrically arranged at opposite lateral sides of said main body with respect to said through holes.

* * * * *